(12) United States Patent
Chen et al.

(10) Patent No.: US 12,295,149 B2
(45) Date of Patent: May 6, 2025

(54) CAPACITOR STRUCTURE AND METHOD FOR FORMING THE SAME

(71) Applicant: Anhui Cambricon Information Technology Co., Ltd., Anhui (CN)

(72) Inventors: Shuai Chen, Anhui (CN); Zhiwei Qiu, Anhui (CN); Junwei Zhang, Anhui (CN)

(73) Assignee: Anhui Cambricon Information Technology Co., Ltd., Anhui (CN)

( * ) Notice: Subject to any disclaimer, the term of this patent is extended or adjusted under 35 U.S.C. 154(b) by 245 days.

(21) Appl. No.: 17/622,520

(22) PCT Filed: Aug. 13, 2021

(86) PCT No.: PCT/CN2021/112554
§ 371 (c)(1),
(2) Date: Dec. 23, 2021

(87) PCT Pub. No.: WO2022/052741
PCT Pub. Date: Mar. 17, 2022

(65) Prior Publication Data
US 2023/0215909 A1    Jul. 6, 2023

(30) Foreign Application Priority Data
Sep. 14, 2020   (CN) .................. 202010963852.6

(51) Int. Cl.
*H10D 1/00*    (2025.01)
*H01L 21/48*   (2006.01)
(Continued)

(52) U.S. Cl.
CPC ......... *H10D 1/042* (2025.01); *H01L 21/4853* (2013.01); *H01L 21/4857* (2013.01);
(Continued)

(58) Field of Classification Search
CPC ............. H01L 28/40–92; H01L 23/642; H01L 27/0805
See application file for complete search history.

(56) References Cited

U.S. PATENT DOCUMENTS

2006/0051916 A1   3/2006  Chung
2010/0200949 A1   8/2010  Booth, Jr. et al.
(Continued)

FOREIGN PATENT DOCUMENTS

CN    102751230 A    10/2012
CN    103681613 A     3/2014
(Continued)

OTHER PUBLICATIONS

International Search Report for PCT/CN2021/112554 mailed on Nov. 11, 2021.
(Continued)

*Primary Examiner* — Evan G Clinton
(74) *Attorney, Agent, or Firm* — The PL Law Group, PLLC

(57) ABSTRACT

A method according to an embodiment is for forming a capacitor structure on a wafer. A first capacitor is formed on a first side of a wafer, and a second capacitor is formed on a second side of the wafer. The capacitor structure includes the first capacitor and the second capacitor. A trench capacitor is fabricated at both ends of an interposer, which can increase capacitance, and greatly improve the stability of the supplied power.

17 Claims, 9 Drawing Sheets

(51) Int. Cl.
  *H01L 23/498* (2006.01)
  *H01L 23/64* (2006.01)
  *H01L 25/16* (2023.01)
  *H10B 80/00* (2023.01)
  *H10D 1/68* (2025.01)

(52) U.S. Cl.
  CPC ...... *H01L 21/486* (2013.01); *H01L 23/49816* (2013.01); *H01L 23/49833* (2013.01); *H01L 23/49838* (2013.01); *H01L 23/642* (2013.01); *H01L 25/165* (2013.01); *H10B 80/00* (2023.02); *H10D 1/716* (2025.01)

(56) References Cited

U.S. PATENT DOCUMENTS

| | | | |
|---|---|---|---|
| 2012/0091593 A1 | 4/2012 | Cheng et al. | |
| 2015/0076657 A1 | 3/2015 | Chou | |
| 2015/0145104 A1 | 5/2015 | Bauer et al. | |
| 2018/0190580 A1* | 7/2018 | Haba | H01G 4/40 |
| 2019/0229181 A1* | 7/2019 | Jia | H01L 23/49575 |
| 2020/0058732 A1 | 2/2020 | Lu et al. | |
| 2020/0066443 A1 | 2/2020 | Lu et al. | |
| 2023/0261572 A1* | 8/2023 | Roth | H01L 23/49589 257/499 |
| 2024/0088103 A1* | 3/2024 | Huang | H01L 28/90 |

FOREIGN PATENT DOCUMENTS

| | | | | |
|---|---|---|---|---|
| CN | 104465521 A | | 3/2015 | |
| CN | 104465630 A | | 3/2015 | |
| CN | 107818970 A | | 3/2018 | |
| CN | 111052377 A | | 4/2020 | |
| CN | 112151535 A | * | 12/2020 | ......... H01L 21/8221 |
| KR | 10-2004-0102421 A | | 12/2004 | |
| WO | WO-2017217342 A1 | * | 12/2017 | ......... A61B 1/00163 |

OTHER PUBLICATIONS

Office action issued on Feb. 23, 2025 from China Patent Office in a counterpart China Patent Application No. 202010963852.6 (English translation is also submitted herewith.)

* cited by examiner

CAPACITOR STRUCTURE AND METHOD FOR FORMING THE SAME

CROSS-REFERENCE TO RELATED APPLICATIONS AND CLAIM OF PRIORITY

This application claims benefit under 35 U.S.C. 119, 120, 121, or 365(c), and is a National Stage entry from International Application No. PCT/CN2021/112554, filed Aug. 13, 2021, which claims priority to the benefit of Chinese Patent Application No. 202010963852.6 filed in the China Intellectual Property Office on Sep. 14, 2020, the entire contents of which are incorporated herein by reference.

BACKGROUND

1. Technical Field

The present disclosure relates generally to a semiconductor. More particularly, the present disclosure relates to a capacitor structure and a method of forming the same.

2. Background Art

CoWoS (chip on wafer on substrate) is an integration production technique, in which a chip is first connected to a silicon wafer through a CoW (chip on wafer) packaging process, and then the CoW chip is connected with a substrate, to integrate into CoWoS. Through such a technique, a plurality of chips can be packaged together, and dies on a plane are interconnected with each other through silicon interposers, which achieves technical effects of small packaging volume, low power consumption, and fewer pins. The power source of the CoWoS is supplied by means of capacitor storage, and the capacitor is often fabricated using a deep trench capacitor (DTC) technique.

Nowadays, chips have higher and higher computing power, especially after the advent of deep learning chips, but capacitance generated by the current deep trench capacitor technique cannot support the requirements of efficient computing chips. Therefore, trench capacitors with high capacitance are urgently needed.

SUMMARY

To at least partially solve the technical problem mentioned in the background, solutions of the present disclosure provide a capacitor structure and a method of forming the same.

In one aspect of the present disclosure, there is disclosed a method of forming a capacitor structure on a wafer that includes a first side and a second side opposite the first side. The method includes: forming a first capacitor on the first side; and forming a second capacitor on the second side, where the capacitor structure includes the first capacitor and the second capacitor.

In another aspect of the present disclosure, there is disclosed a capacitor structure that includes a first capacitor and a second capacitor on an opposite side. The second capacitor includes: a first conductive layer, a second dielectric layer, a second conductive layer, a first redistribution layer, a second redistribution layer, a first wafer bump, and a second wafer bump. The first conductive layer is disposed in the bottom areas and sidewalls of a plurality of deep trenches and above a surface of a wafer, a width and a depth of each deep trench correspond to a specific proportion, and the plurality of deep trenches are spaced apart a specific distance; the second dielectric layer is disposed above the first conductive layer; the second conductive layer is disposed above the second dielectric layer, and remaining portions of the plurality of deep trenches not filled by the first conductive layer and the second dielectric layer are fully filled by the second conductive layer; the first redistribution layer is electrically connected with the first conductive layer; the second redistribution layer is electrically connected with the second conductive layer; the first wafer bump is electrically connected with the first redistribution layer; and the second wafer bump is electrically connected with the second redistribution layer, where the first wafer bump and the second wafer bump are positive and negative electrodes of the second capacitor.

In the solutions of the present disclosure, in order to increase capacitance density, a trench capacitor is fabricated at both ends of an interposer to increase capacitance, thereby greatly improving the stability of the supplied power.

BRIEF DESCRIPTION OF THE DRAWINGS

The above and other objectives, features and advantages of exemplary embodiments of the present disclosure will become readily apparent from the following detailed description, which proceeds with reference to the accompanying drawings. In the accompanying drawings, several embodiments of the present disclosure are illustrated exemplarily rather than restrictively, and identical or corresponding reference numerals refer to identical or corresponding parts, in which.

DETAILED DESCRIPTION

The technical solutions in the embodiments of the present disclosure will be clearly and completely described below in conjunction with the accompanying drawings in the embodiments of the present disclosure, and it is obvious that described embodiments are only some of the embodiments of the present disclosure, but not all of them. All other embodiments, which can be derived by those skilled in the art from the embodiments disclosed herein without making any creative effort, shall fall within the scope of protection of the present disclosure.

It should be understood that terms such as "first", "second", "third", and "fourth" in the claims, description, and drawings of the present disclosure are used to distinguish different objects, rather than to describe a specific order. Terms "including" and "comprising", which are used in the description and claims of the present disclosure, indicate the presence of stated features, unity, steps, operations, elements, and/or components, but they do not preclude the presence or addition of one or more other features, unity, steps, operations, elements, components, and/or combinations thereof.

It should also be understood that terms used in the specification of the present disclosure are only for the purpose of describing specific embodiments, and are not intended to limit the present disclosure. As used in the description and claims of the present disclosure, "a", "an", and "this" in the singular are intended to include the plural, unless other cases are clearly stated in the context. It should be further understood that a term "and/or" used in the description and claims of the present disclosure refers to any and all possible combinations of one or more of associated listed items and includes these combinations.

As used in this description and claims, a term "if" may be interpreted as "when", or "once", or "in response to determining", or "in response to detecting" according to the context.

Specific embodiments of the present disclosure will be described in detail below in conjunction with the accompanying drawings.

Figure 1:
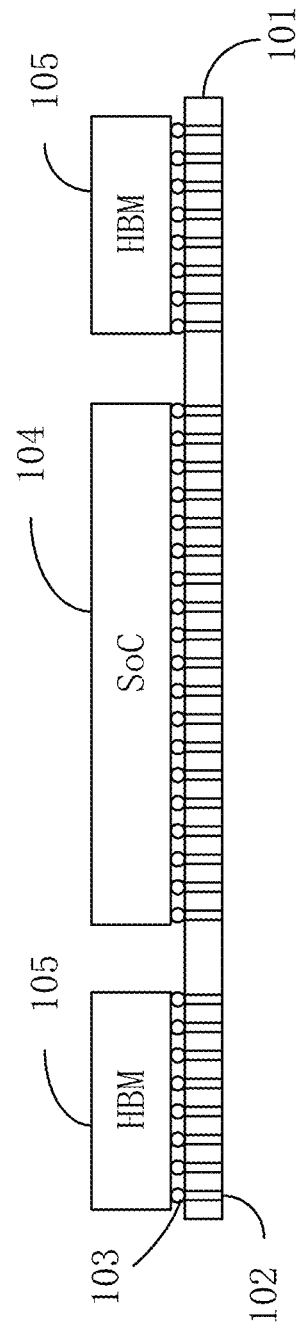
FIG. 1 illustrates a packaging process structure of CoW according to an embodiment of the present disclosure.

FIG. 1 illustrates a packaging process structure of CoW, which is to generate a plurality of through silicon vias (TSVs) 102 on a wafer 101. A TSV technique is a high-density packaging technique to replace a wire bonding technique, by adopting the technique, a vertical electrical interconnection between TSVs may be realized by filling conductive materials such as copper, tungsten, polysilicon. Through the vertical interconnection, the technique shortens the length of interconnection, reduces signal latency and unnecessary capacitance/inductance, realizes low power consumption and high-speed communication between chips, increases bandwidth and realizes miniaturization of device integration.

Then, by using a micro bump preparation technique, a micro bump 103 is formed to bond the chip with the wafer 101. Chips in the figure are exemplarily shown as a system on chip (SoC) 104 and a plurality of off-chip memories 105. The system on chip 104 is an integrated circuit with a special purpose, in which one or more combination processing devices can be integrated in the present disclosure. The combination processing device may be an artificial intelligence arithmetic unit to support various deep learning and machine learning algorithms, and can meet intelligent processing requirements in complex scenes in fields such as computer vision, speech, natural language processing, data mining. The off-chip memory 105 is exemplarily shown as a high bandwidth memory (HBM), and is a novel memory chip, in which a plurality of DDR chips are stacked together for realizing a large storage space. In practice, 2, 4 or 8 DDR chips can be stacked.

In addition to the system on chip 104 and the off-chip memories 105, chips of the present disclosure can also include various integrated circuits, for example, various passive and active microelectronic devices, such as resistors, other types of capacitors (for example, MIMCAP (Metal Insulator Metal Capacitor)), inductors, diodes, metal-oxide-semiconductor field-effect transistors (MOSFET), complementary metal oxide semiconductor (CMOS) transistors, bipolar junction transistors (BJT), laterally-diffused metal-oxide semiconductor (LDMOS) transistors, high-power metal oxide semiconductor transistors or other types of transistors, etc.

Figure 2:
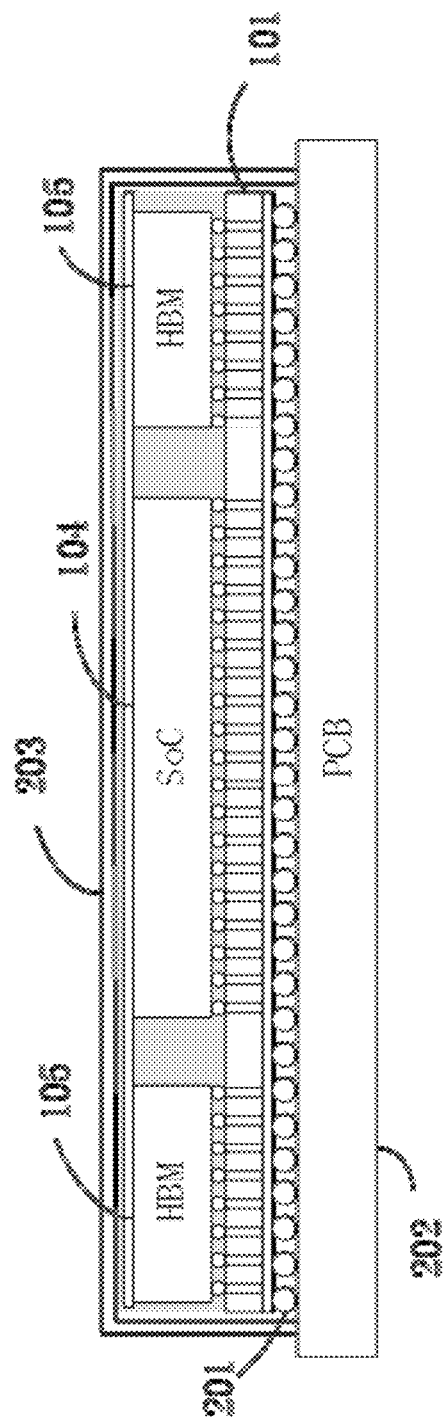
FIG. 2 illustrates a packaging process structure of CoWOS according to an embodiment of the present disclosure.

CoWoS is formed by connecting a substrate on the basis of the CoW process shown in FIG. 1. FIG. 2 illustrates a packaging process structure of CoWoS, and the process is: the system on chip 104 and the off-chip memories 105 are filled with underfill, then the system on chip 104 and the off-chip memories 105 are spot-welded with solder balls 201, and bonded onto a substrate (for example, printed circuit board) 202, and finally a package 203 is added. CoWoS can allow the plurality of chips to share the wafer 101. Generally, the CoWoS technique theoretically can allow the thickness of the overall package to be reduced by up to 70%.

According to an embodiment of the present disclosure, a plurality of capacitors are formed on the wafer 101 to supply power to the chips, and the greater the generated capacitance is, the more stably the power is supplied. For a deep learning chip with high power consumption, great capacitance is required. The present disclosure proposes a solution of forming a capacitor structure on upper and lower sides of a wafer in the CoWoS process. The capacitor is a deep trench capacitor, which is formed by etching a plurality of vertical trenches on the wafer, and the more the trenches, the greater the capacitance.

Figure 3:
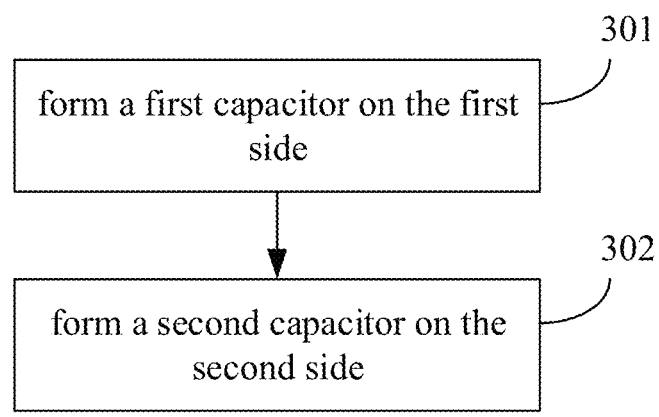
FIG. 3 is a flowchart illustrating a method of forming a capacitor structure according to an embodiment of the present disclosure.

An embodiment of the present disclosure is a method of forming a capacitor structure on upper and lower sides of a wafer that includes a first side (upper side) and a second side (lower side) opposite the first side. The method is shown in FIG. 3, in which in a step 301, a first capacitor is formed on the first side; and in a step 302, a second capacitor is formed on the second side. The capacitor structure includes the first capacitor and the second capacitor.

Figure 4:
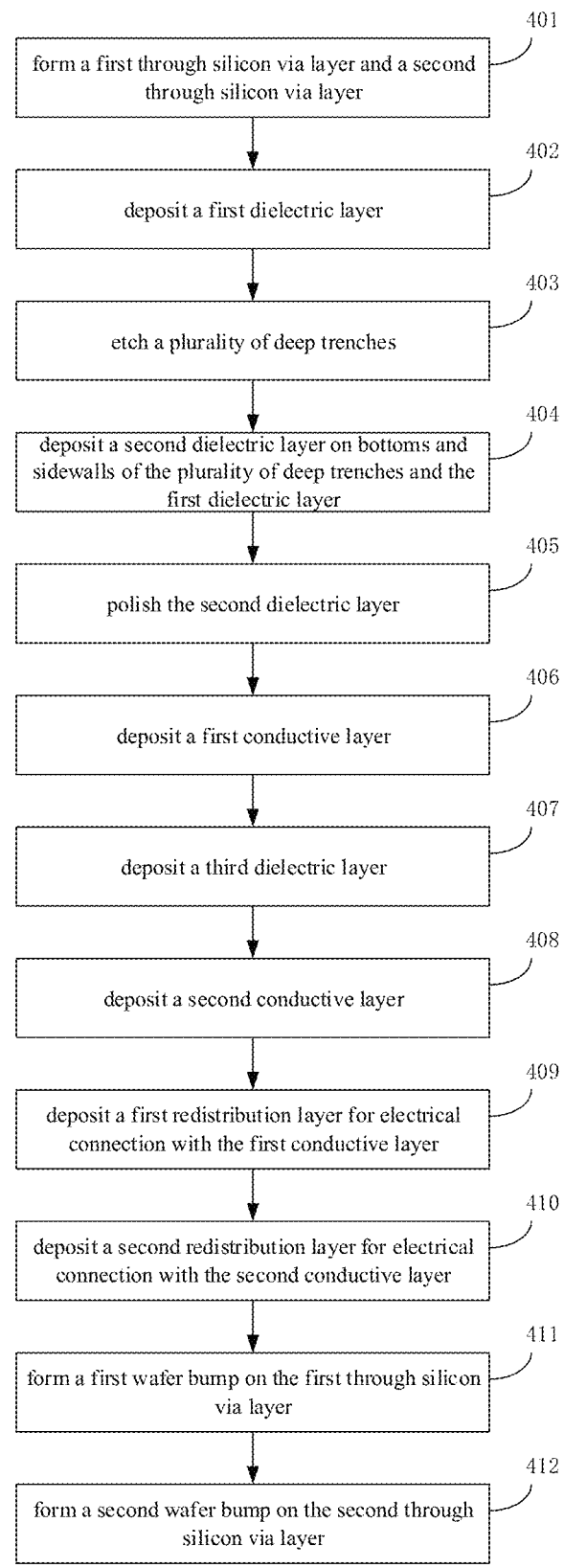
FIG. 4 is a flowchart illustrating the formation of a first capacitor according to an embodiment of the present disclosure.
Figure 5:
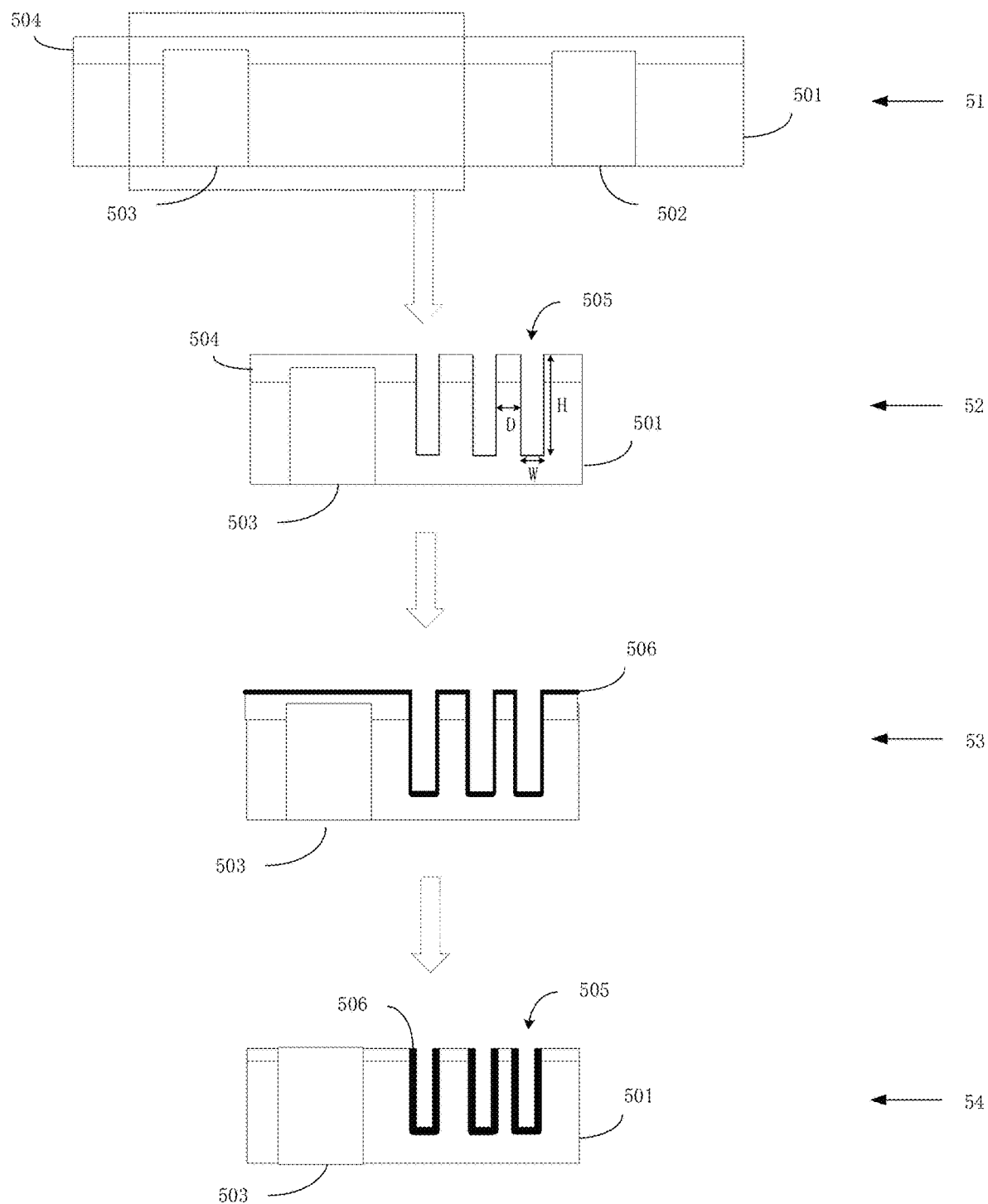
FIG. 5 is a schematic diagram illustrating the formation of a first capacitor according to an embodiment of the present disclosure.
Figure 6:
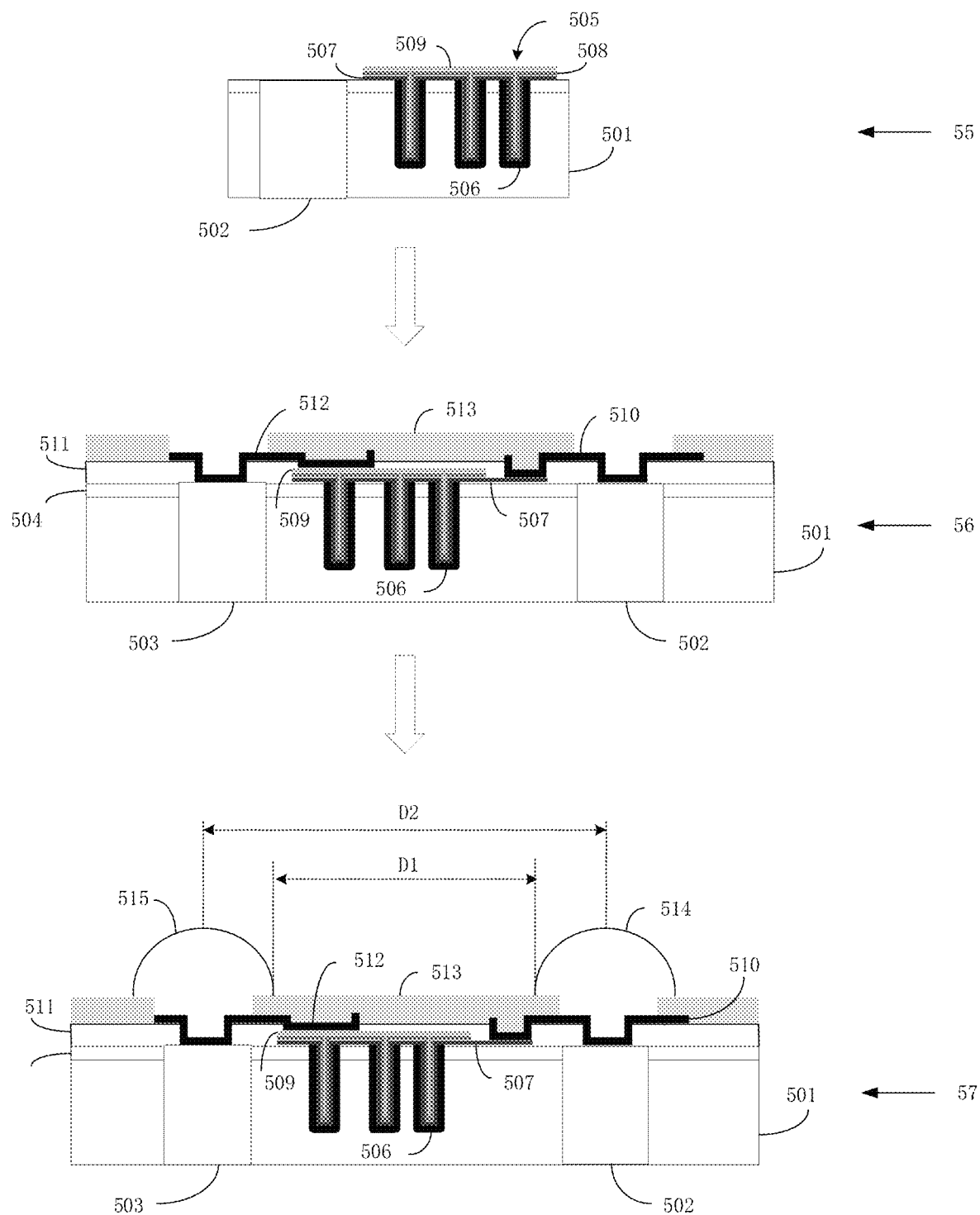
FIG. 6 is a schematic diagram illustrating the formation of a first capacitor according to an embodiment of the present disclosure.

The step 301 can be understood with reference to FIGS. 4, 5, and 6 and their explanations. FIG. 4 illustrates a detailed flow of the step 301, and FIGS. 5 and 6 illustrate corresponding structures. The following description will be made with simultaneous reference to FIGS. 4, 5, and 6.

In a step 401, a first through silicon via layer 502 and a second through silicon via layer 503 are formed on the first side of the wafer 501 by using mask etching; and in a step 402, a first dielectric layer 504 made of silicon nitride is deposited above the first through silicon via layer 502 and the second through silicon via layer 503 by using low temperature chemical vapor deposition. After this step is completed, a structure 51 is formed on the first side of the wafer 501.

Next, a step 403 is performed, in which a plurality of deep trenches 505 are etched on the first side, which are distributed between the first through silicon via layer 502 and the second through silicon via layer 503. In this embodiment, the shape of openings of the deep trenches 505 may be one of rectangle, trapezoid, parallelogram, and triangle. After this step is completed, a structure 52 is formed on the first side of the wafer 501.

In one possible situation, the width W of each deep trench 505 is in a specific proportion to its depth H, and the specific proportion is between 1:3 and 1:15. Advantageously, the specific proportion is between 1:7 and 1:9. More advantageously, the specific proportion specifically is 1:8.

In another possible situation, the width W of each deep trench 505 is between 0.8 micron and 5 microns, and its depth H is between 3 microns and 15 microns. Advantageously, the width W is between 1 micron and 1.2 microns and the depth H is between 5.6 microns and 10.8 microns. More advantageously, the width W is 1 micron and the depth H is 8 microns.

Each deep trench 505 is spaced apart a specific distance D, and the specific distance D is between 0.5 micron and 4 microns. In this embodiment, advantageously, the specific distance D is 2 microns.

In a step 404, a second dielectric layer 506 is deposited above bottoms and sidewalls of the plurality of deep trenches 505 and the first dielectric layer 504, such that the thickness of the second dielectric layer 506 at the bottoms of the deep trenches 505 is about 0.3 micron. After this step is completed, a structure 53 is formed on the first side of the wafer 501.

In a step 405, the second dielectric layer 506 is polished. In this embodiment, a surface of the first side is polished flat using chemical mechanical polishing (CMP), such that surfaces of all the through silicon via layers (only the second through silicon via layer 503 is illustrated in FIG. 5) are flush with the surface of the first side, in other words, a surface of the second through silicon via layer 503 is exposed on the first side. After this step is completed, a structure 54 is formed on the first side of the wafer 501.

In a step 406, a first conductive layer 507 is deposited above the second dielectric layer 506; in a step 407, a third dielectric layer 508 is deposited above the first conductive layer 507; and in a step 408, a second conductive layer 509 is deposited above the third dielectric layer 508. Remaining portions of the deep trenches 505 not filled by the first conductive layer 507 and the third dielectric layer 508 are fully filled by the second conductive layer 509, in other words, the deep trenches 505 are filled up by the first conductive layer 507, the third dielectric layer 508, and the second conductive layer 509. The third dielectric layer 508 is used for electrically isolating the first conductive layer 507 from the second conductive layer 509. After this step is completed, a structure 55 is formed on the first side of the wafer 501.

In a step 409, a first redistribution layer 510 is deposited for electrical connection with the first conductive layer 507. More specifically, through the mask layout arrangements, a fourth dielectric layer 511 is deposited first, and then the first redistribution layer 510 is deposited, and meanwhile, the first redistribution layer 510 is electrically connected to the first through silicon via layer 502. In a step 410, a second redistribution layer 512 is deposited for electrical connection with the second conductive layer 509. Through the mask layout arrangements, the second redistribution layer 512 is deposited first, and then a fifth dielectric layer 513 is deposited, and meanwhile, the second redistribution layer 512 is electrically connected to the second through silicon via layer 503. After this step is completed, a structure 56 is formed on the first side of the wafer 501.

In a step 411, a first wafer bump 514 is formed on the first through silicon via layer 502, so that the first wafer bump 514 is electrically connected to the first redistribution layer 510; and in a step 412, a second wafer bump 515 is formed on the second through silicon via layer 503, so that the second wafer bump 515 is electrically connected to the second redistribution layer 512. Advantageously, a distance D1 between the first wafer bump 514 and the second wafer bump 515 is 60 microns, and a distance D2 between centers of the bumps is 130, 150 or 180 microns.

The first wafer bump 514 and the second wafer bump 515 adopt a C4 (controlled collapse chip connection) process, and are used as positive and negative electrodes of the first capacitor. More specifically, charges on one side are stored in the first conductive layer 507 of the deep trenches 505 through the first wafer bump 514 and the first redistribution layer 510 (the first through silicon via layer 502), and charges on the other side are stored in the second conductive layer 509 of the deep trenches 505 through the second wafer bump 515 and the second redistribution layer 512 (the second through silicon via layer 503). The first conductive layer 507 and the second conductive layer 509 are electrically isolated from each other by using the third dielectric layer 508. The first capacitor is formed by the overall structure.

Figure 7:
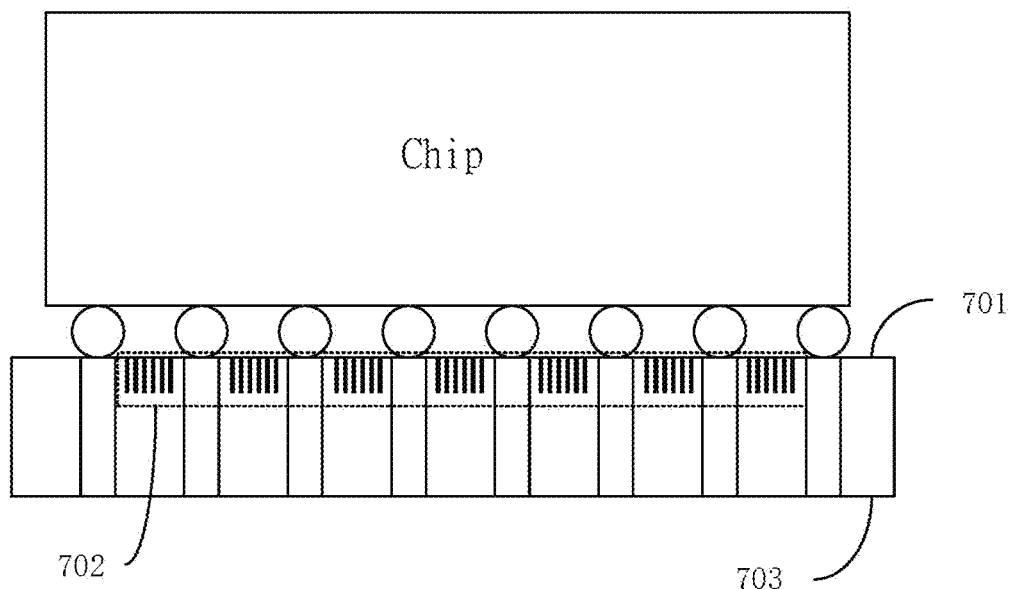
FIG. 7 illustrates a packaging process structure of CoW according to another embodiment of the present disclosure.

Finally, a chip is attached to the first wafer bump 514 and the second wafer bump 515, so that a packaging process structure of CoW shown in FIG. 7 is formed. The packaging process structure of CoW of this embodiment is different from that of FIG. 1, in which a first capacitor 702 is formed on a first side 701.

In this embodiment, in addition to the system on chip 104 and the off-chip memories 105 in FIG. 1, the chip can also include various other chips, which are not described again.

Returning to FIG. 3, after the step 301 is performed, the step 302 is performed, in which a second capacitor is formed on the second side of the wafer 501. To perform this step, the CoW packaging process structure of FIG. 7 shall be turned over, so that a second side 703 of the wafer faces upward, on which the second capacitor is fabricated.

Figure 8:
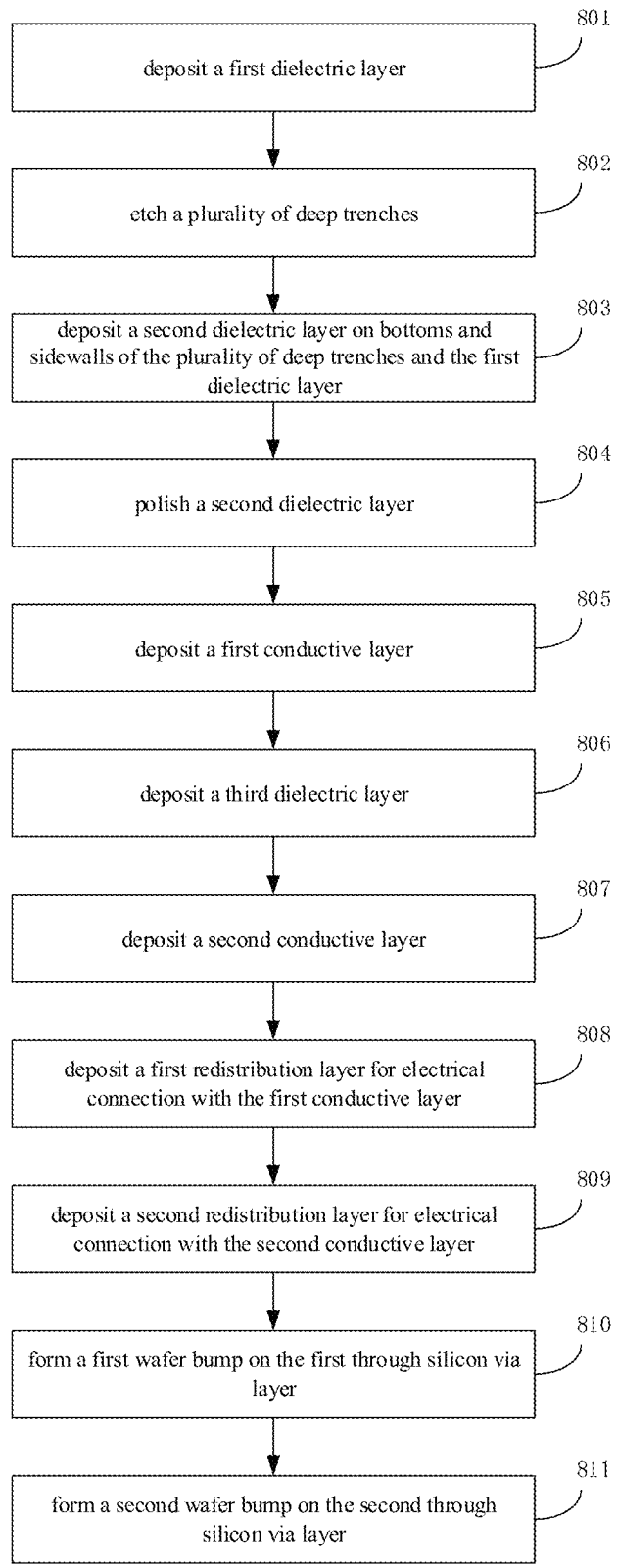
FIG. 8 is a flowchart illustrating the formation of a second capacitor according to an embodiment of the present disclosure.

The step 302 can be similarly subdivided into FIGS. 5, 6 and 8. In a step 801, a first dielectric layer 504 also made of silicon nitride is deposited on the first through silicon via layer 502 and the second through silicon via layer 503 by using low temperature chemical vapor deposition. After this step is completed, a structure 51 is formed on the second side of the wafer 501.

Next, a step 802 is performed, in which a plurality of deep trenches 505 are etched on the second side, which are distributed between the first through silicon via layer 502 and the second through silicon via layer 503. In this embodiment, the shape of openings of the deep trenches 505 is one of rectangle, trapezoid, parallelogram, and triangle. After this step is completed, a structure 52 is formed on the second side of the wafer 501.

In one possible situation, the width W of each deep trench 505 is in a specific proportion to its depth H, and the specific proportion is between 1:3 and 1:15. Advantageously, the specific proportion is between 1:7 and 1:9. More advantageously, the specific proportion specifically is 1:8.

In one possible situation, the width W of each deep trench 505 is between 0.8 micron and 5 microns, and its depth H is between 3 microns and 15 microns. Advantageously, the width W is between 1 micron and 1.2 microns, and the depth H is between 5.6 microns and 10.8 microns. More advantageously, the width W is 1 micron, and the depth H is 8 microns.

Each deep trench 505 is spaced apart a specific distance D, and the specific distance D is between 0.5 micron and 4 microns. In this embodiment, advantageously, the specific distance D is 2 microns.

In a step 803, a second dielectric layer 506 is deposited on bottoms and sidewalls of the plurality of deep trenches 505 and the first dielectric layer 504, so that the thickness of the second dielectric layer 506 at the bottoms of the deep trenches 505 is about 0.3 micron. After this step is completed, a structure 53 is formed on the second side of the wafer 501.

In a step 804, a second dielectric layer 506 is polished. According to this embodiment, a surface of the second side is polished flat using chemical mechanical polishing, so that surfaces of all the through silicon via layers (only the second through silicon via layer 503 is illustrated in FIG. 5) are flush with the surface of the second side, in other words, a surface of the second through silicon via layer 503 is exposed on the second side. After this step is completed, a structure 54 is formed on the second side of the wafer 501.

In a step 805, a first conductive layer 507 is deposited above the second dielectric layer 506; in a step 806, a third dielectric layer 508 is deposited above the first conductive layer 507; and in a step 807, a second conductive layer 509 is deposited above the third dielectric layer 508, and remaining portions of the deep trenches 505 not filled by the first conductive layer 507 and the third dielectric layer 508 are fully filled by the second conductive layer 509, in other words, the deep trenches 505 are filled up by the first conductive layer 507, the third dielectric layer 508, and the second conductive layer 509. The third dielectric layer 508 is used for electrically isolating the first conductive layer 507 from the second conductive layer 509. After this step is completed, a structure 55 is formed on the second side of the wafer 501.

In a step 808, a first redistribution layer 510 is deposited for electrical connection with the first conductive layer 507. More specifically, through the mask layout arrangements, a fourth dielectric layer 511 is deposited first, and then the first redistribution layer 510 is deposited, wherein the first redistribution layer 510 is electrically connected to the first through silicon via layer 502. In a step 809, a second redistribution layer 512 is deposited for electrical connection with the second conductive layer 509. Through the mask layout arrangements, the second redistribution layer 512 is deposited first, and then a fifth dielectric layer 513 is deposited, wherein the second redistribution layer 512 is electrically connected to the second through silicon via layer 503. After this step is completed, a structure 56 is formed on the second side of the wafer 501.

In a step 810, a first wafer bump 514 is formed on the first through silicon via layer 502, so that the first wafer bump 514 is electrically connected to the first redistribution layer 510; in a step 811, a second wafer bump 515 is formed on the second through silicon via layer 503, so that the second wafer bump 515 is electrically connected to the second redistribution layer 512. Advantageously, a distance D1 between the first wafer bump 514 and the second wafer bump 515 is 60 microns, and a distance D2 between centers of the bumps is 130, 150 or 180 microns.

The first wafer bump 514 and the second wafer bump 515 also adopt the C4 process, and are used as positive and negative electrodes of the second capacitor. Charges on one side are stored in the first conductive layer 507 of the deep trenches 505 through the first wafer bump 514 and the first redistribution layer 510 (the first through silicon via layer 502), and charges on the other side are stored in the second conductive layer 509 of the deep trenches 505 through the second wafer bump 515 and the second redistribution layer 512 (the first through silicon via layer 503). The first conductive layer 507 and the second conductive layer 509 are electrically isolated from each other by using the third dielectric layer 508.

Figure 9:
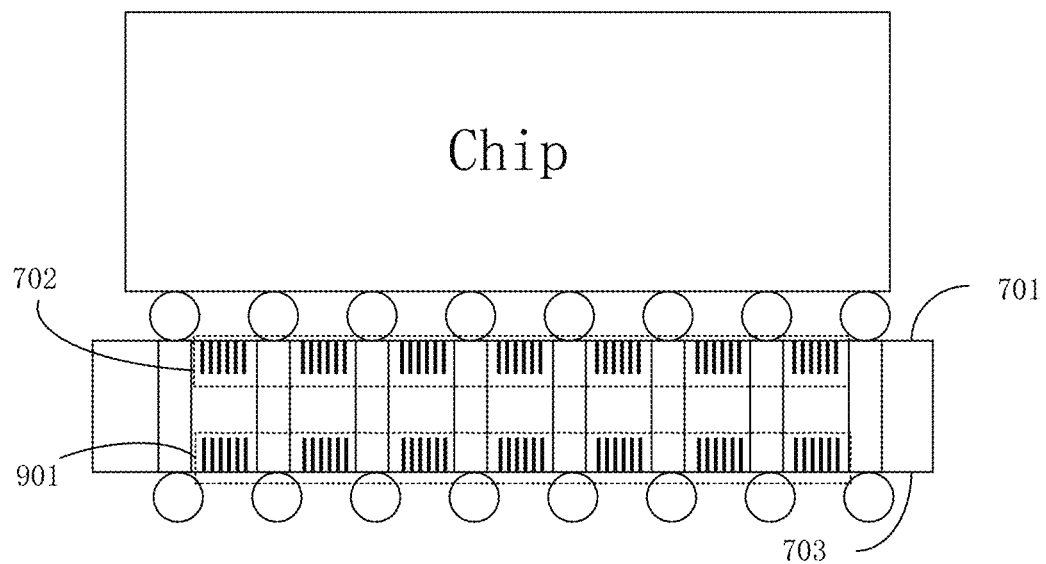
FIG. 9 illustrates a packaging process structure of CoW including a first capacitor and a second capacitor according to an embodiment of the present disclosure.

FIG. 9 illustrates a packaging process structure of CoW including a first capacitor and a second capacitor. According to this embodiment, the first capacitor 702 is formed on the first side 701 of the wafer, a second capacitor 901 is formed on the second side 703, and the first capacitor 702 and the second capacitor 901 are electrically connected through the through silicon via layers. Finally, the chip in FIG. 9 is filled with underfill, bonded onto a printed circuit board, and then packaged, so that the CoWoS packaging process structure similar to that shown in FIG. 2 is completed. Due to the presence of the first capacitor 702 and the second capacitor 901, large capacitance is provided by the process, so that the power is stably supplied to the chip.

Another embodiment of the present disclosure is a capacitor structure as shown in FIG. 9, that includes the first capacitor 702 located on the first side 701 of the wafer and the second capacitor 901 located on the second side 703 of the wafer, which are electrically connected with each other. The following description will be made with simultaneous reference to FIGS. 5, 6, and 9. Both the first capacitor 702 and the second capacitor 901 include: the first conductive layer 507, the second dielectric layer 508, the second conductive layer 509, the first redistribution layer 510, the second redistribution layer 512, the first wafer bump 514, and the second wafer bump 515.

The first conductive layer 507 is disposed in the bottom areas and sidewalls of the plurality of deep trenches 505 and above a surface of the wafer 501. In one possible situation, the width W of each deep trench 505 is in a specific proportion to its depth H, and the specific proportion is between 1:3 and 1:15. Advantageously, the specific proportion is between 1:7 and 1:9. More advantageously, the specific proportion specifically is 1:8. In another possible situation, the width W of each deep trench 505 is between 0.8 micron and 5 microns, and its depth H is between 3 microns and 15 microns. Advantageously, the width W is between 1 micron and 1.2 microns and the depth H is between 5.6 microns and 10.8 microns. More advantageously, the width W is 1 micron and the depth H is 8 microns. Each deep trench 505 is spaced apart a specific distance D, and the specific distance D is between 0.5 micron and 4 microns. In this embodiment, advantageously, the specific distance D is 2 microns. The shape of openings of the deep trenches 505 can be one of rectangle, trapezoid, parallelogram, and triangle.

The second dielectric layer 508 is disposed above the first conductive layer 507; and the second conductive layer 509 is disposed above the second dielectric layer 508, and remaining portions of the deep trenches 505 not filled by the first conductive layer 507 and the second dielectric layer 508 are fully filled by the second conductive layer 509.

The first redistribution layer 510 is electrically connected to the first conductive layer 507, the second redistribution layer 512 is electrically connected to the second conductive layer 509, the first wafer bump 514 is electrically connected to the first redistribution layer 510, and the second wafer bump 515 is electrically connected to the second redistribution layer 512, where the first wafer bump 514 and the second wafer bump 515 are positive and negative electrodes of the first capacitor 702 and the second capacitor 901.

According to the solutions of the present disclosure, by disposing the first capacitor and the second capacitor on the upper and lower sides of the wafer, the capacitance density of the trench capacitor is improved, and the capacitance is increased, which greatly improves the stability of the supplied power.

The above content can be better understood in light of the following clauses:

A1. A method of forming a capacitor structure on a wafer, wherein the wafer includes a first side and a second side opposite the first side, the method including: forming a first capacitor on the first side; and forming a second capacitor on the second side; wherein the capacitor structure includes the first capacitor and the second capacitor.

A2. The method of A1, wherein the forming a second capacitor includes: forming a first through silicon via layer and a second through silicon via layer; and depositing a first dielectric layer above the first through silicon via layer and the second through silicon via layer.

A3. The method of A2, wherein the forming a second capacitor further includes: etching a plurality of deep trenches on the second side, wherein a width and a depth of each deep trench corresponds to a specific proportion, and the plurality of deep trenches are spaced apart a specific distance; depositing a second dielectric layer above bottoms and sidewalls of the plurality of deep trenches and the first dielectric layer; depositing a first conductive layer above the second dielectric layer; depositing a third dielectric layer above the first conductive layer; depositing a second conductive layer above the third dielectric layer, wherein remaining portions of the plurality of deep trenches not filled by the first conductive layer and the third dielectric layer are fully filled by the second conductive layer; depositing a first redistribution layer for electrical connection with the first conductive layer; and depositing a second redistribution layer for electrical connection with the second conductive layer, wherein the first redistribution layer is electrically connected to the first through silicon via layer, and the second redistribution layer is electrically connected to the second through silicon via layer.

A4. The method of A3, wherein the forming a second capacitor further includes: forming a first wafer bump above the first through silicon via layer, wherein the first wafer bump is electrically connected with the first redistribution layer; and forming a second wafer bump above the second through silicon via layer, wherein the second wafer bump is electrically connected with the second redistribution layer, wherein the first wafer bump and the second wafer bump are positive and negative electrodes of the second capacitor.

A5. The method of A4, wherein the forming the first wafer bump and the second wafer bump employs a C4 process.

A6. The method of A4, wherein a distance between the first wafer bump and the second wafer bump is 60 microns.

A7. The method of A4, wherein a distance between centers of the first wafer bump and the second wafer bump is 150 microns.

A8. The method of A3, wherein the plurality of deep trenches are located between the first through silicon via layer and the second through silicon via layer.

A9. The method of A3, wherein the shape of openings of the deep trenches is one of rectangle, trapezoid, parallelogram, and triangle.

A10. The method of A3, wherein the specific proportion is between 1:3 and 1:15.

A11. The method of A10, wherein the specific proportion is between 1:7 and 1:9.

A12. The method of A11, wherein the specific proportion is 1:8.

A13. The method of A3, wherein the width is between 0.8 micron and 5 microns, and the depth is between 3 microns and 15 microns.

A14. The method of A13, where the width is between 1 micron and 1.2 microns, and the depth is between 5.6 microns and 10.8 microns.

A15. The method of A14, wherein the width is 1 micron, and the depth is 8 microns.

A16. The method of A3, wherein the specific distance is between 0.5 micron and 4 microns.

A17. The method of A16, wherein the specific distance is 2 microns.

A18. The method of A3, further including polishing the second dielectric layer before depositing the first conductive layer.

A19. The method of A1, further including: die attaching a system on chip or an off-chip memory on the first side.

A20. A capacitor structure, including a first capacitor and a second capacitor on an opposite side, wherein the second capacitor includes: a first conductive layer disposed above bottom regions and sidewalls of a plurality of deep trenches and a surface of a wafer, wherein a width and a depth of each deep trench corresponds to a specific proportion, and the plurality of deep trenches are spaced apart a specific distance; a second dielectric layer disposed above the first conductive layer; a second conductive layer disposed above the second dielectric layer, wherein remaining portions of the plurality of deep trenches not filled by the first conductive layer and the second dielectric layer are fully filled by the second conductive layer; a first redistribution layer electrically connected to the first conductive layer; a second redistribution layer electrically connected to the second conductive layer; a first wafer bump electrically connected to the first redistribution layer; and a second wafer bump electrically connected to the second redistribution layer, wherein the first wafer bump and the second wafer bump are positive and negative electrodes of the second capacitor.

A21. The capacitor structure of A20, wherein the shape of openings of the deep trenches is one of rectangle, trapezoid, parallelogram, and triangle.

A22. The capacitor structure of A20, wherein the specific proportion is between 1:7 and 1:9.

A23. The capacitor structure of A22, wherein the specific proportion is 1:8.

A24. The capacitor structure of A20, wherein the width is between 0.8 micron and 1.2 microns, and the depth is between 5.6 microns and 10.8 microns.

A25. The capacitor structure of A24, wherein the width is 1 micron, and the depth is 8 microns.

A26. The capacitor structure of A20, wherein the specific distance is between 0.5 micron and 4 microns.

A27. The capacitor structure of A26, wherein the specific distance is 2 microns.

The embodiments of the present disclosure have been discussed in detail above, specific examples have been applied herein to elaborate the principles and implementations of the present disclosure, and the description of the embodiments above is only used to help understand the method and core idea of the present disclosure; meanwhile, for those of ordinary skill in the art, according to the idea of the present disclosure, there will be variations in both the implementations and the application range. In summary, the contents of this specification should not be construed as restrictions on the present disclosure.

What is claimed is:

1. A method of forming a capacitor structure on a wafer comprising a first side and a second side opposite to the first side, the method comprising:
   forming a first capacitor on the first side;
   forming a second capacitor on the second side; and
   polishing the second dielectric layer before depositing the first conductive layer
   wherein the capacitor structure comprises the first capacitor and the second capacitor;
   wherein the forming of the second capacitor includes:
   forming a first through silicon via layer and a second through silicon via layer; and depositing a first dielectric layer above the first through silicon via layer and the second through silicon via layer;

wherein the forming of the second capacitor further includes:

etching a plurality of deep trenches on the second side, wherein a width and a depth of each deep trench corresponds to a specific proportion, and the plurality of deep trenches are spaced apart a specific distance;

depositing a second dielectric layer above bottoms and sidewalls of the plurality of deep trenches and the first dielectric layer;

depositing a first conductive layer above the second dielectric layer;

depositing a third dielectric layer above the first conductive layer;

depositing a second conductive layer above the third dielectric layer, wherein remaining portions of the plurality of deep trenches not filled by the first conductive layer and the third dielectric layer are fully filled by the second conductive layer;

depositing a first redistribution layer for electrical connection with the first conductive layer; and depositing a second redistribution layer for electrical connection with the second conductive layer, wherein the first redistribution layer is electrically connected to the first through silicon via layer, and the second redistribution layer is electrically connected to the second through silicon via layer.

2. The method of claim 1, wherein the forming of the second capacitor further includes:

forming a first wafer bump above the first through silicon via layer, wherein the first wafer bump is electrically connected to the first redistribution layer; and forming a second wafer bump above the second through silicon via layer, wherein the second wafer bump is electrically connected to the second redistribution layer, wherein the first wafer bump and the second wafer bump are positive and negative electrodes of the second capacitor.

3. The method of claim 2, wherein the forming the first wafer bump and the second wafer bump employs a C4 process.

4. The method of claim 2, wherein a distance between the first wafer bump and the second wafer bump is 60 microns.

5. The method of claim 2, wherein a distance between centers of the first wafer bump and the second wafer bump is 150 microns.

6. The method of claim 1, wherein the plurality of deep trenches are located between the first through silicon via layer and the second through silicon via layer.

7. The method of claim 1, where the shape of openings of the deep trenches is one of rectangle, trapezoid, parallelogram, and triangle.

8. The method of claim 1, wherein the specific proportion is between 1:3 and 1:15.

9. The method of claim 1, wherein the width is between 0.8 micron and 5 microns, and the depth is between 3 microns and 15 microns.

10. The method of claim 9, wherein the width is between 1 micron and 1.2 microns, and the depth is between 5.6 microns and 10.8 microns.

11. The method of claim 1, wherein the specific distance is between 0.5 micron and 4 microns.

12. The method of claim 1, further comprising:

die attaching a system on chip or an off-chip memory on the first side.

13. A capacitor structure comprising a first capacitor and a second capacitor formed on a side opposite to the first capacitor, the second capacitor comprising:

a first through silicon via layer and a second through silicon via layer;

a first dielectric layer above the first through silicon via layer and the second through silicon via layer;

a second dielectric layer disposed above bottom regions and sidewalls of a plurality of deep trenches and the first dielectric layer, wherein a width and a depth of each deep trench corresponds to a specific proportion, and the plurality of deep trenches are spaced apart a specific distance;

a first conductive layer disposed above the the second dielectric layer;

a third dielectric layer disposed above the first conductive layer;

a second conductive layer disposed above the third dielectric layer, wherein remaining portions of the plurality of deep trenches not filled by the first conductive layer and the third dielectric layer are fully filled by the second conductive layer;

a first redistribution layer electrically connected to the first conductive layer;

a second redistribution layer electrically connected to the second conductive layer;

a first wafer bump electrically connected to the first redistribution layer; and a second wafer bump electrically connected to the second redistribution layer, wherein the first wafer bump and the second wafer bump are positive and negative electrodes of the second capacitor, wherein the first redistribution layer is electrically connected to the first through silicon via layer, and the second redistribution layer is electrically connected to the second through silicon via layer, wherein the second dielectric layer is polished before the first conductive layer is deposited.

14. The capacitor structure of claim 13, wherein the shape of openings of the deep trenches is one of rectangle, trapezoid, parallelogram, and triangle.

15. The capacitor structure of claim 13, wherein the specific proportion is between 1:7 and 1:9.

16. The capacitor structure of claim 13, wherein the width is between 0.8 micron and 1.2 microns, and the depth is between 5.6 microns and 10.8 microns.

17. The capacitor structure of claim 13, wherein the specific distance is between 0.5 micron and 4 microns.

* * * * *